United States Patent
Xu et al.

(10) Patent No.: US 10,825,538 B2
(45) Date of Patent: Nov. 3, 2020

(54) SHIFT REGISTER UNIT, DRIVING METHOD THEREOF AND GATE DRIVING CIRCUIT

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Zhicai Xu, Beijing (CN); Jia Sun, Beijing (CN); Lijun Xiao, Beijing (CN)

(73) Assignees: CHONGQING BOE OPTOELECTRONICS TECHNOLOGY CO., LTD., Beibei, Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/609,574

(22) PCT Filed: Mar. 12, 2019

(86) PCT No.: PCT/CN2019/077817
§ 371 (c)(1),
(2) Date: Oct. 30, 2019

(87) PCT Pub. No.: WO2019/179334
PCT Pub. Date: Sep. 26, 2019

(65) Prior Publication Data
US 2020/0058362 A1 Feb. 20, 2020

(30) Foreign Application Priority Data
Mar. 19, 2018 (CN) .......................... 2018 1 0223962

(51) Int. Cl.
*G11C 19/28* (2006.01)
*G09G 3/20* (2006.01)
*G09G 3/36* (2006.01)

(52) U.S. Cl.
CPC ............... *G11C 19/28* (2013.01); *G09G 3/20* (2013.01); *G09G 3/3677* (2013.01); *G09G 2300/0408* (2013.01); *G09G 2310/0286* (2013.01)

(58) Field of Classification Search
CPC ...... G09G 3/20; G09G 3/3266; G09G 3/3677; G09G 2300/0408; G09G 2310/0286; G11C 19/28
See application file for complete search history.

(56) References Cited

U.S. PATENT DOCUMENTS 8,548,115 B2 * 10/2013 Shang .................. G09G 3/3677
377/64
8,654,055 B2  2/2014 Kim et al.
(Continued)

FOREIGN PATENT DOCUMENTS

CN  102024500 A  4/2011
CN  104575430 A  4/2015
(Continued)

OTHER PUBLICATIONS

First Office Action for Chinese Application No. 201810223962.1, dated Dec. 18, 2019, 6 Pages.
(Continued)

*Primary Examiner* — Patrick O Neill
(74) *Attorney, Agent, or Firm* — Brooks Kushman P.C.

(57) ABSTRACT

A shift register unit, a driving method and a gate driving circuit are provided. The shift register unit includes a pull-up node control circuit, a pull-down node control circuit, a capacitor circuit, an output circuit and a noise reduction
(Continued)

adjustment circuit. The noise reduction adjustment circuit is connected to a pull-down node and a first level input end, and configured to reduce an increasing rate of a potential at the pull-down node within a noise reduction time period of a maintenance phase, and reduce a decreasing rate of the potential at the pull-down node within a non-noise-reduction time period of the maintenance phase.

14 Claims, 3 Drawing Sheets

(56) References Cited

U.S. PATENT DOCUMENTS

| | | |
|---|---|---|
| 2010/0164915 A1 | 7/2010 | Kim et al. |
| 2011/0057926 A1 | 3/2011 | Shang |
| 2011/0148853 A1 | 6/2011 | Ko |
| 2016/0365054 A1 | 12/2016 | Wu et al. |
| 2017/0270892 A1 | 9/2017 | Wang |
| 2018/0188578 A1 | 7/2018 | Wang et al. |
| 2020/0058362 A1 | 2/2020 | Xu et al. |

FOREIGN PATENT DOCUMENTS

| | | |
|---|---|---|
| CN | 105118414 A | 12/2015 |
| CN | 105938711 A | 9/2016 |
| CN | 108389542 A | 8/2018 |
| KR | 20110069970 | 6/2011 |

OTHER PUBLICATIONS

International Search Report and Written Opinion for Application No. PCT/CN2019/077817, dated Jun. 18, 2019, 11 Pages.

* cited by examiner

SHIFT REGISTER UNIT, DRIVING METHOD THEREOF AND GATE DRIVING CIRCUIT

CROSS-REFERENCE TO RELATED APPLICATIONS

This application is the U.S. national phase of PCT Application No. PCT/CN2019/077817 filed on Mar. 12, 2019, which claims priority to Chinese Patent Application No. 201810223962.1 filed on Mar. 19, 2018, which are incorporated herein by reference in their entireties.

TECHNICAL FIELD

The present disclosure relates to the field of display technology, in particular to a shift register unit, a driving method thereof and a gate driving circuit.

BACKGROUND

Along with the development of the display technology, a Gate On Array (GOA) technique has been adopted by more and more display devices. For the GOA technique, a gate driving circuit is directly integrated to a non-display region of an array substrate, so as to reduce the manufacture cost as well the quantity of manufacture processes while reducing a width of a bezel of the array substrate. The gate driving circuit integrated into the array substrate through the GOA technique includes a plurality of shift register units. Each shift register unit corresponds to one gate line on the array substrate, and outputs a gate driving signal to drive the gate line.

Within each operating period of the shift register unit in the related art, at a maintenance stage, a potential at a pull-down node of the shift register unit is controlled through a clock signal, so as to control a gate driving signal output end of the shift register unit to be in a floating state where no gate driving signal is outputted. However, when the clock signal is at a high level at the maintenance stage, a leakage current for the shift register unit may increase, so a characteristic of a thin film transistor (TFT) of the shift register unit may be offset forward. When the clock signal is at a low level, the shift register unit may lose its noise reduction capability, so an output abnormality may occur for the shift register unit.

SUMMARY

An object of the present disclosure is to provide a shift register unit, a driving method and a gate driving circuit, so as to solve the above-mentioned problem.

In one aspect, the present disclosure provides in some embodiments a shift register unit, including: a pull-up node control circuit connected to an input signal end, a pull-up node, a resetting end, a first level input end and a pull-down node; a pull-down node control circuit connected to a first clock signal input end, the pull-up node, the first level input end and the pull-down node; a capacitor circuit connected to the pull-up node and a gate driving signal output end; an output circuit connected to a second clock signal input end, the pull-up node, the pull-down node, the gate driving signal output end, the first level input end and the resetting end; and a noise reduction adjustment circuit connected to the pull-down node and the first level input end, and configured to reduce an increasing rate of a potential at the pull-down node within a noise reduction time period of a maintenance phase for the shift register unit, and reduce a decreasing rate of the potential at the pull-down node within a non-noise-reduction time period of the maintenance phase.

In a possible embodiment of the present disclosure, the noise reduction adjustment circuit includes a second capacitor, a first end of which is connected to the pull-down node, and a second end of which is connected to the first level input end.

In a possible embodiment of the present disclosure, the noise reduction adjustment circuit further includes a first resistor via which the second end of the second capacitor is connected to the first level input end.

In a possible embodiment of the present disclosure, the shift register unit further includes: a first enhancement noise reduction circuit connected to the input signal end, the first clock signal input end and the pull-up node, and configured to control the input signal end to be electrically connected to, or electrically disconnected from, the pull-up node under the control of the first clock signal input end; and/or a second enhancement noise reduction circuit connected to the gate driving signal output end, the first level input end and the first clock signal input end, and configured to control the gate driving signal output end to be electrically connected to, or electrically disconnected from, the first level input end under the control of the first clock signal input end.

In a possible embodiment of the present disclosure, the pull-up node control circuit is configured to control the pull-up node to be electrically connected to, or electrically disconnected from, the input signal end under the control of the input signal end, control the pull-up node to be electrically connected to, or electrically disconnected from, the first level input end under the control of the resetting end, and control the pull-up node to be electrically connected to, or electrically disconnected from, the first level input end under the control of the pull-down node. The output circuit is configured to control the second clock signal input end to be electrically connected to, or electrically disconnected from, the gate driving signal output end under the control of the pull-up node, control the gate driving signal output end to be electrically connected to, or electrically disconnected from, the first level input end under the control of the pull-down node, and control the gate driving signal output end to be electrically connected to, or electrically disconnected from, the first level input end under the control of the resetting end.

In a possible embodiment of the present disclosure, the pull-up node control circuit includes a first switching transistor, a second switching transistor and a third switching transistor. A gate electrode and a second electrode of the first switching transistor are connected to the input signal end, and a first electrode of the first switching transistor is connected to the pull-up node. A gate electrode of the second switching transistor is connected to the resetting end, a first electrode of the second switching transistor is connected to the first level input end, and a second electrode of the second switching transistor is connected to the pull-up node. A gate electrode of the third switching transistor is connected to the pull-down node, a first electrode of the third switching transistor is connected to the first level input end, and a second electrode of the third switching transistor is connected to the pull-up node.

In a possible embodiment of the present disclosure, the output circuit includes a fourth switching transistor, a fifth switching transistor and a sixth switching transistor. A gate electrode of the fourth switching transistor is connected to the pull-up node, a first electrode of the fourth switching transistor is connected to the gate driving signal output end, and a second electrode of the fourth switching transistor is connected to the second clock signal input end. A gate electrode of the fifth switching transistor is connected to the pull-down node, a first electrode of the fifth switching transistor is connected to the first level input end, and a second electrode of the fifth switching transistor is connected to the gate driving signal output end. A gate electrode of the sixth switching transistor is connected to the resetting end, a first electrode of the sixth switching transistor is connected to the first level input end, and a second electrode of the sixth switching transistor is connected to the gate driving signal output end.

In a possible embodiment of the present disclosure, the pull-down node control circuit includes a seventh switching transistor, an eighth switching transistor, a ninth switching transistor and a tenth switching transistor. A gate electrode and a second electrode of the seventh switching transistor are connected to the first clock signal end, and a first electrode of the seventh switching transistor is connected to a pull-down control node. A gate electrode of the eighth switching transistor is connected to the pull-up node, a first electrode of the eighth switching transistor is connected to the first level input end, and a second electrode of the eighth switching transistor is connected to the pull-down control node. A gate electrode of the ninth switching transistor is connected to the pull-down control node, a first electrode of the ninth switching transistor is connected to the pull-down node, and a second electrode of the ninth switching transistor is connected to the first clock signal input end. A gate electrode of the tenth switching transistor is connected to the pull-up node, a first electrode of the tenth switching transistor is connected to the first level input end, and a second electrode of the tenth switching transistor is connected to the pull-down node.

In a possible embodiment of the present disclosure, the first enhancement noise reduction circuit includes an eleventh switching transistor, a gate electrode of which is connected to the first clock signal input end, a first electrode of which is connected to the pull-up node, and a second electrode of which is connected to the input signal end. The second enhancement noise reduction circuit includes a twelfth switching transistor, a gate electrode of which is connected to the first clock signal input end, a first electrode of which is connected to the first level input end, and a second electrode of which is connected to the gate driving signal output end.

In a possible embodiment of the present disclosure, the capacitor circuit includes a first capacitor, a first end of which is connected to the pull-up node, and a second end of which is connected to the gate driving signal output end.

In a possible embodiment of the present disclosure, within the noise reduction time period, a first clock signal from the first clock signal input end is a low level, a second clock signal from the second clock signal input end is a high level, and a resetting signal from the resetting end is a low level. Within the non-noise-reduction time period, the first clock signal from the first clock signal input end is a high level, the second clock signal from the second clock signal input end is a low level, and the resetting signal from the resetting end is a low level.

In another aspect, the present disclosure provides in some embodiments a gate driving circuit including the above-mentioned shift register unit.

In yet another aspect, the present disclosure provides in some embodiments a method for driving the above-mentioned shift register unit, including, within a noise reduction time period of a maintenance phase, reducing, by a noise reduction adjustment circuit, an increasing rate of a potential at a pull-down node, and within a non-noise-reduction time period of the maintenance phase, reducing, by the noise reduction adjustment circuit, a decreasing rate of the potential at the pull-down node.

In a possible embodiment of the present disclosure, within the noise reduction time period, a first clock signal at a low level is applied to a first clock signal input end, a second clock signal at a high level is applied to a second clock signal input end, and a resetting signal at a low level is applied to a resetting end. Within the non-noise-reduction time period, the first clock signal at a high level is applied to the first clock signal input end, the second clock signal at a low level is applied to the second clock signal input end, and the resetting signal at a low level is applied to the resetting end.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The present disclosure will be described hereinafter in more details in conjunction with the drawings and embodiments.

In the related art, each operating period of a shift register unit includes an input phase, an output phase, a resetting phase and a maintenance phase arranged sequentially. Within the input phase, the output phase and the resetting phase, the following functions will be achieved principally. At first, a gate driving signal is outputted by a gate driving signal output end of the shift register unit to a corresponding gate line on an array substrate, and then the gate driving signal is reset to a gate turn-off voltage. At the maintenance phase, parts of TFTs of the shift register unit are turned on under the control of a clock signal, so as to maintain a potential at the gate driving signal output end to be the gate turn-off voltage.

In the related art, depending on different working condition of the shift register unit, the clock signal may be set as a square signal at a high or low level at the maintenance phase, or a direct current low-level signal or a direct current high-level signal at the maintenance phase. However, regardless of the type of the clock signal at the maintenance phase, there exist the following problems for the shift register unit.

At first, when the clock signal is at a high level, a serious leakage current may probably occur for a TFT in the shift register unit associated with the clock signal. At this time, after a long-term use, a threshold voltage drift may occur for the TFT, so an output abnormality may occur for the shift register unit and the output reliability may be deteriorated.

In addition, when the clock signal is at a low level, a TFT having a noise reduction function in the shift register unit may probably be in an off state, so the shift register unit may lose its noise reduction capability and the output abnormally may occur for the shift register unit.

Apart from the above, the clock signal may change between the high level and the low level during the entire operating period, so as to ensure the normal operation of the shift register unit. For the shift register unit, the TFT for noise reduction is merely turned on within a part of the time period, so as to provide the shift register unit with the noise reduction function. In other words, for the shift register unit in the related art, a noise reduction time period may be relatively short, and thereby a noise may easily occur.

Figure 1:
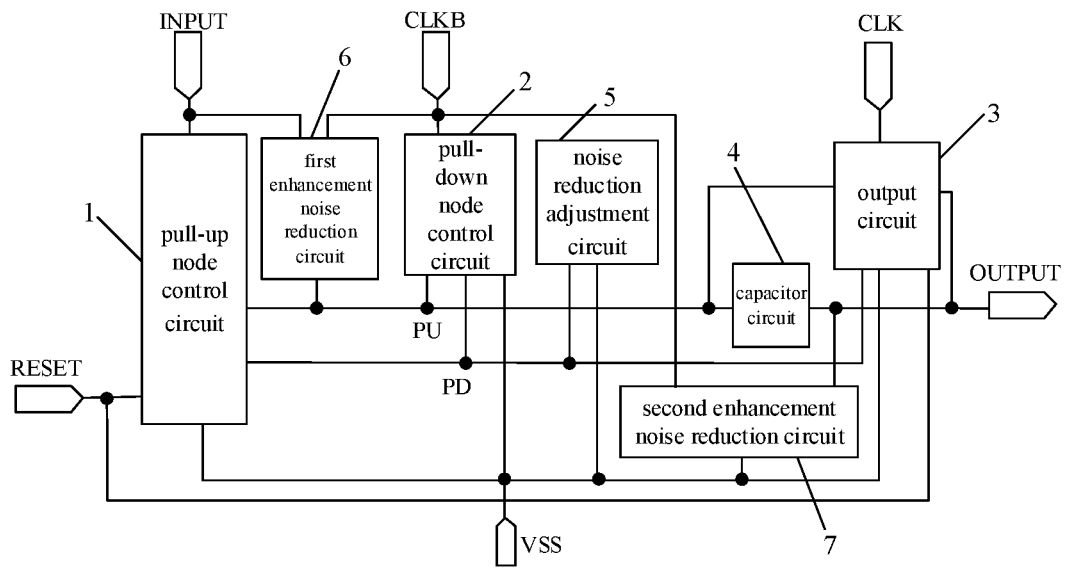
FIG. 1 is a schematic view showing a shift register unit according to one embodiment of the present disclosure.

In order to solve the above problems, the present disclosure provides in some embodiments a shift register unit which, as shown in FIG. 1, includes: a pull-up node control circuit 1, a pull-down node control circuit 2, a capacitor circuit 4, an output circuit 3 and a noise reduction adjustment circuit 5. The pull-up node control circuit 1 is connected to an input signal end INPUT, a pull-up node PU, a resetting end RESET, a first level input end VSS and a pull-down node PD. The pull-down node control circuit 2 is connected to a first clock signal input end CLKB, the pull-up node PU, the first level input end VSS and the pull-down node PD. A first end of the capacitor circuit 4 is connected to the pull-up node PU, and a second end of the capacitor circuit 4 is connected to a gate driving signal output end OUTPUT. The output circuit 3 is connected to a second clock signal input end CLK, the pull-up node PU, the pull-down node PD, the gate driving signal output end OUTPUT, the first level input end VSS and the resetting end RESET. The noise reduction adjustment circuit 5 is connected to the pull-down node PD and the first level input end VSS, and configured to reduce an increasing rate of a potential at the pull-down node PD within a noise reduction time period of a maintenance phase P4, and reduce a decreasing rate of the potential at the pull-down node PD within a non-noise-reduction time period of the maintenance phase P4.

Figure 2:
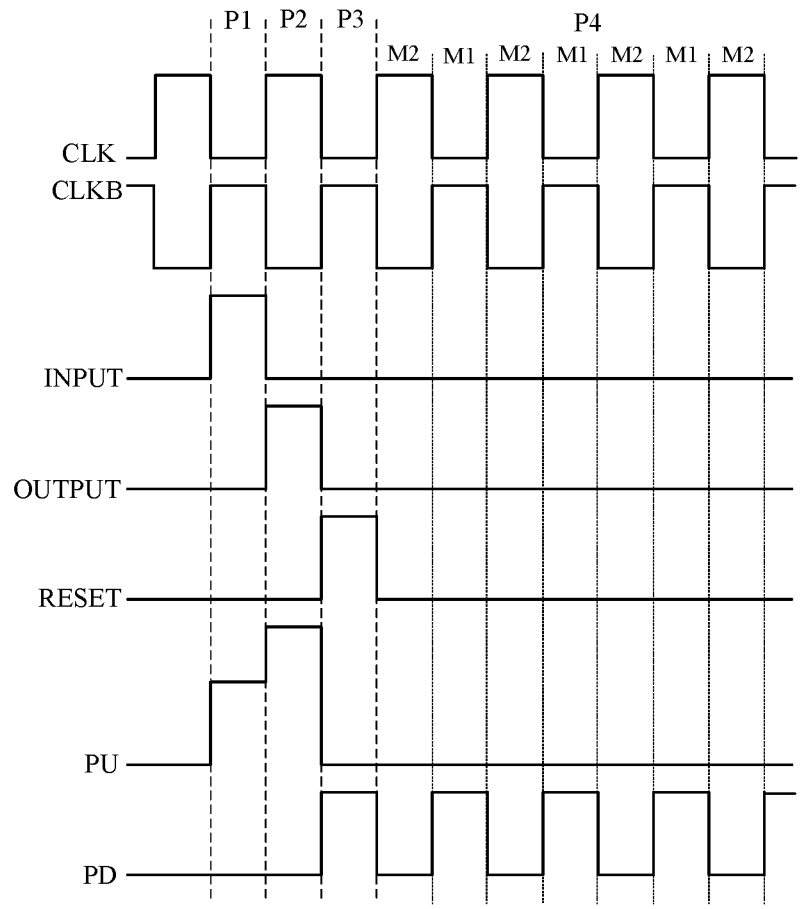
FIG. 2 is a time sequence diagram of the operation of the shift register unit according to one embodiment of the present disclosure.

To be specific, as shown in FIG. 2, each operating period of the shift register unit may include an input phase P1, an output phase P2, a resetting phase P3 and the maintenance phase P4 arranged sequentially. An operating procedure of the shift register unit within each operating period will be described as follows.

At the input phase P1, the pull-up node control circuit 1 may control the input signal end INPUT to be electrically connected to the pull-up node PU under the control of the input signal end INPUT, so as to pull up a potential at the pull-up node PU. The pull-down node control circuit 2 may control the pull-down node PD to be electrically connected to the first level input end VSS under the control of the pull-up node PU.

At the output phase P2, the output circuit 3 may control the second clock signal input end CLK to be electrically connected to the gate driving signal output end OUTPUT under the control of the second clock signal input end CLK and the pull-up node PU, so as to enable the gate driving signal output end OUTPUT to output a gate driving signal, and further pull up the potential at the pull-up node PU. The pull-down node control circuit 2 may continue to control the pull-down node PD to be electrically connected to the first level input end VSS under the control of the pull-up node PU.

At the resetting phase P3, the pull-up node control circuit 1 may control the pull-up node PU to be electrically connected to the first level input end VSS under the control of the resetting end RESET, so as to pull down the potential at the pull-up node PU. The pull-down node control circuit 2 may control the first clock signal input end CLKB to be electrically connected to the pull-down node PD under the control of the first clock signal input end CLKB and the pull-up node PU at a low potential, so as to pull up a potential at the pull-down node PD. The pull-up node control circuit 1 may control the pull-up node PU to be electrically connected to the first level input end VSS under the control of the pull-down node PD at a high potential. The output circuit 3 may control the gate driving signal output end OUTPUT to be electrically connected to the first level input end VSS under the control of the pull-down node PD at a high potential, so as to enable the gate driving signal output end OUTPUT not to output the gate driving signal. The output circuit 3 may control the gate driving signal output end OUTPUT to be electrically connected to the first level input end VSS under the control of the resetting end RESET.

At the maintenance phase P4, the pull-down node control circuit 2 may control the potential at the pull-down node PD to change synchronously with a first clock signal (inputted by the first clock signal input end CLKB) under the control of the first clock signal input end CLKB and the pull-up node PU at a low potential. Further, the maintenance phase P4 may include the noise reduction time period M1 and the non-noise-reduction time period M2. Within the noise reduction time period M1, the potential at the pull-down node PD may be pulled up to a high potential along with the first clock signal. Under the control of the pull-down node PD at a high potential, the output circuit 3 may control the gate driving signal output end OUTPUT to be electrically connected to the first level input end VSS, and the pull-up node control circuit 1 may control the pull-up node PU to be electrically connected to the first level input end VSS, so as to achieve a noise reduction function of the shift register unit. Within the non-noise-reduction time period M2, the potential at the pull-down node PD may be pulled down to a low potential along with the first clock signal, so as to prevent the occurrence of a relatively large leakage current for a TFT in each module connected to the pull-down node PD, thereby to prevent a characteristic of each TFT from being offset forward. In addition, at the maintenance phase P4, the pull-up node PU is at a low potential. Under the control of the pull-up node PU at a low potential, the output circuit 3 may control the gate driving signal output end OUTPUT to be electrically disconnected from the second clock signal input end CLK, so as to further enable the gate driving signal output end OUTPUT not to output the gate driving signal.

In addition, at the maintenance phase P4, the noise reduction adjustment circuit 5 may adjust a change rate of the potential at the pull-down node PD. To be specific, within the noise reduction time period of the maintenance phase P4, the noise reduction adjustment circuit 5 may reduce the increasing rate of the potential at the pull-down node PD, and within the non-noise-reduction time period of the maintenance phase P4, the noise reduction adjustment circuit 5 may reduce the decreasing rate of the potential at the pull-down node PD.

Based on the structure of the shift register unit and the operating procedure thereof, the shift register unit may include the noise reduction adjustment circuit 5 connected to the pull-down node PD and the first level input end VSS, and configured to reduce the increasing rate of the potential at the pull-down node PD within the noise reduction time period of the maintenance phase P4, and reduce the decreasing rate of the potential at the pull-down node PD within the non-noise-reduction time period of the maintenance phase P4. As a result, as compared with the conventional shift register unit, it is able for the shift register unit in the embodiments of the present disclosure to slowly pull up the potential at the pull-down node PD from a low potential to a high potential within the noise reduction time period, thereby to increase anti-leakage current capability for the shift register unit while ensuring the noise reduction capability of the shift register unit. In addition, it is able for the shift register unit to slowly pull down the potential at the pull-down node PD from a high potential to a low potential within the non-noise-reduction time period, thereby to ensure the noise reduction capability to some extent while ensuring the anti-leakage current capability for the shift register unit.

In other words, it is able for the shift register unit in the embodiments of the present disclosure to ensure the noise reduction capability and prevent the occurrence of the leakage current at the maintenance phase. As a result, after a long-term use, it is able to ensure the stable characteristic of each TFT in the shift register unit (i.e., prevent a threshold voltage of the TFT from being offset), and ensure the excellent noise reduction performance of the shift register unit at the entire maintenance stage P4, thereby to ensure the stability of the shift register unit in a better manner.

Figure 3:
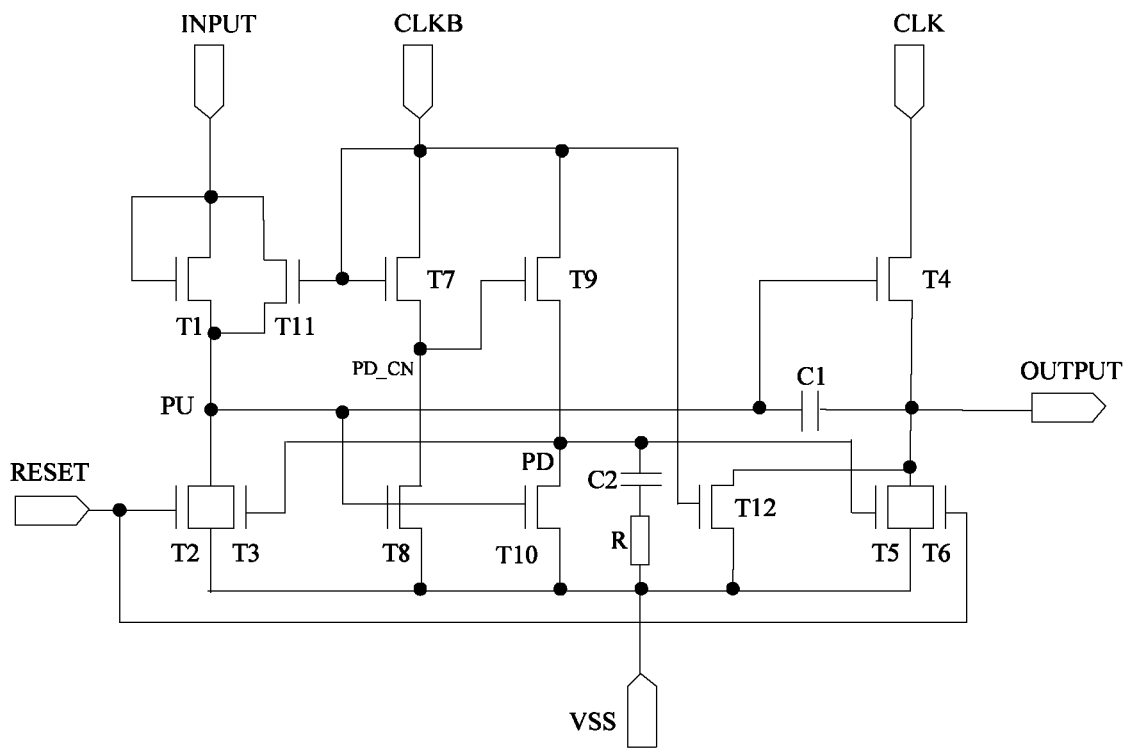
FIG. 3 is a circuit diagram of the shift register unit according to one embodiment of the present disclosure.

The noise reduction adjustment circuit 5 may be of various structures. In a possible embodiment of the present disclosure, as shown in FIG. 3, the noise reduction adjustment circuit 5 may include a noise reduction capacitor C2, a first end of which is connected to the pull-down node PD, and a second end of which is connected to the first level input end VSS.

To be specific, when the noise reduction adjustment circuit 5 includes the noise reduction capacitor C2, within the noise reduction time period, it is necessary to charge the noise reduction capacitor C2 while pulling up the potential at the pull-down node PD to a high potential along with the first clock signal. At this time, a time period for pulling up the potential at the pull-down node PD to a high level may be prolonged, and thereby reducing the increasing rate of the potential at the pull-down node PD. Within the non-noise-reduction time period, when the potential at the pull-down node PD is changed to a low potential along with the first clock signal, a certain quantity of charges are stored in the noise reduction capacitor C2. At this time, a time period for pulling down the potential at the pull-down node PD to a low level may be prolonged, and thereby reducing the decreasing rate of the potential at the pull-down node PD. Hence, when the noise reduction adjustment circuit 5 includes the noise reduction capacitor C2, as compared with the shift register unit in the related art, it is able for the noise reduction capacitor C2 to reduce the increasing rate of the potential at the pull-down node PD within the noise reduction time period and reduce the decreasing rate of the potential at the pull-down node PD within the non-noise-reduction time period, thereby to prevent the occurrence of the leakage current for the shift register unit while ensuring the noise reduction capability at the entire maintenance phase P4, and enable the shift register unit to operate in a more stable manner.

The noise reduction adjustment circuit 5 may further include a noise reduction resistor R via which the second end of the noise reduction capacitor C2 is connected to the first level input end VSS.

To be specific, when the noise reduction adjustment circuit 5 further includes the noise reduction resistor R connected between the noise reduction capacitor C2 and the first level input end VSS, the noise reduction resistor R may have a current-limiting function, so as to further reduce the occurrence of the leakage current for the shift register unit.

Figure 4:
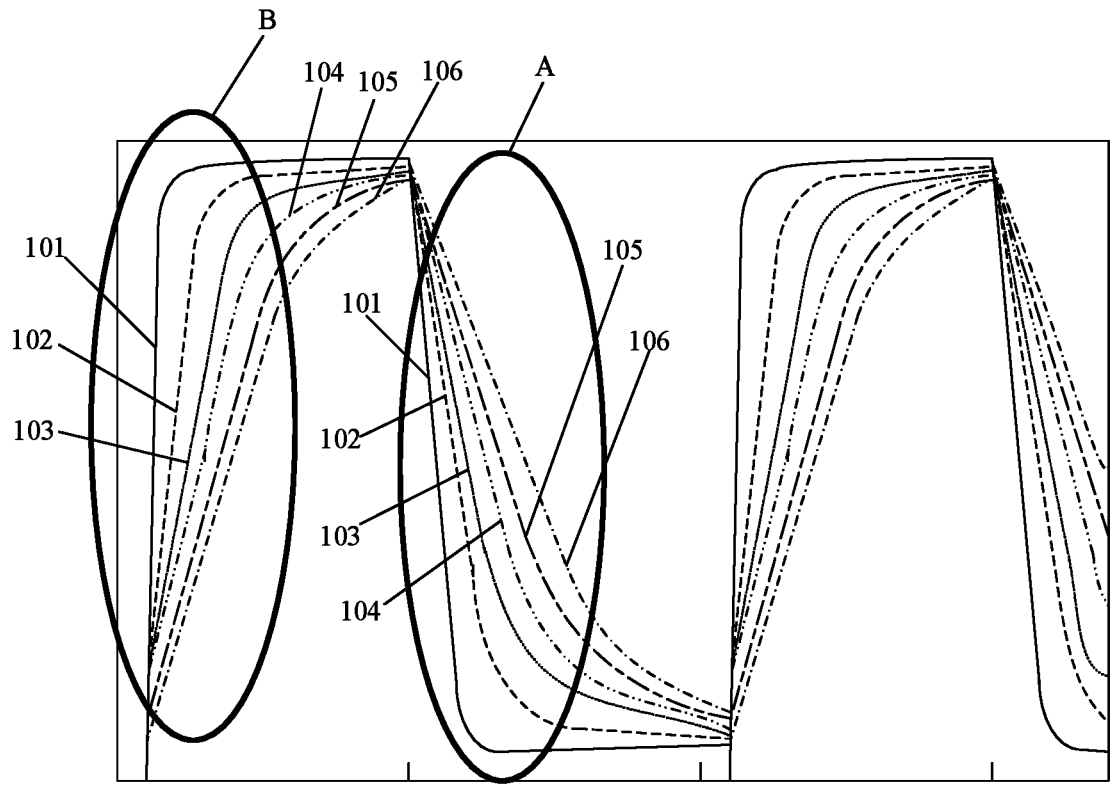
FIG. 4 is a schematic view showing different potentials at a pull-down node PD when the noise reduction adjustment circuit has different capacitances and resistances according to one embodiment of the present disclosure.

It should be appreciated that, the shift register unit may have different noise reduction capabilities and different anti-leakage current capability through adjusting a capacitance of the noise reduction capacitor C2 and a resistance of the noise reduction resistor R. As shown in FIG. 4, a first curve 101, a second curve 102, a third curve 103, a fourth curve 104, a fifth curve 105 and a sixth curve 106 represent waveforms of levels at the pull-down node PD at the maintenance phase P4 respectively with respect to different capacitances of the noise reduction capacitor C2 and different resistances of the noise reduction resistor R. The first curve 101 shows the potential at the pull-down node PD at the maintenance phase P4 when the capacitance of the noise reduction capacitor C2 and the resistance of the noise reduction resistor R are both 0. As shown in FIG. 4, when the capacitance of the noise reduction capacitor C2 and the resistance of the noise reduction resistor R are both 0, the potential at the pull-down node PD corresponding to the first curve 101 may rapidly change from a high level to a low level at a region A (i.e., within the non-noise-reduction time period), so the shift register unit substantially has no noise reduction capability within the non-noise-reduction time period. In addition, the potential at the pull-down node PD corresponding to the first curve 101 may rapidly change from a low level to a high level at a region B (i.e., within the noise reduction time period), so the leakage current for the shift register unit may increase within the noise reduction time period.

Through changing the capacitance of the noise reduction capacitor C2 and the resistance of the noise reduction resistor R, the other five curves may be acquired. As shown in FIG. 4, when the capacitance of the noise reduction capacitor C2 and the resistance of the noise reduction resistor R increase gradually, the second curve 102 to the sixth curve 106 may be acquired. The larger the capacitance of the noise reduction capacitor C2 and the resistance of the noise reduction resistor R are, the more gentle the slope of the curve corresponding to the potential at the pull-down node PD at the region A is, and the more gentle the slope of the curve corresponding to the potential at the pull-down node PD at the region B is. In other words, the potential at the pull-down node PD may have a larger value within the non-noise-reduction time period, and a smaller value within the noise reduction time period. As a result, it is able for the shift register unit to have the noise reduction capability and the anti-leakage current capability at the maintenance phase P4.

Figure 5:
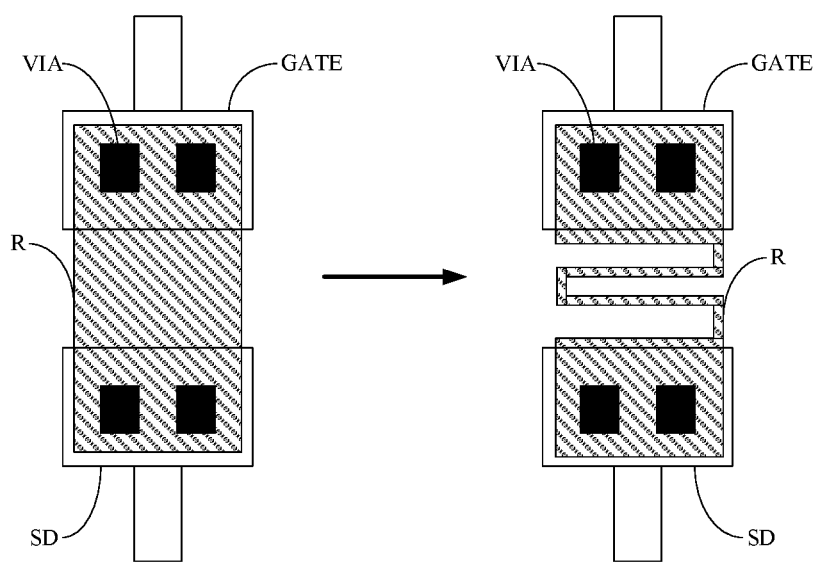
FIG. 5 is a schematic view showing a resistor of the noise reduction adjustment circuit according to one embodiment of the present disclosure.

Further, the noise reduction resistor R may be manufactured in various ways. As shown in FIG. 5, an indium tin oxide (ITO) pattern may be formed between a gate electrode GATE and a source-drain metal electrode SD, and a shape of the ITO pattern may be adjusted so as to adjust the resistance of the noise reduction resistor R. To be specific, the ITO pattern may be formed between the gate electrode GATE and the source-drain metal electrode SD through a via-hole VIA, then the ITO pattern may be adjusted into a serpentine line, and then a width and a length of the serpentine line may be adjusted, so as to adjust the resistance of the noise reduction resistor R.

Referring to FIG. 1 again, the shift register unit may further include a first enhancement noise reduction circuit 6 and/or a second enhancement noise reduction circuit 7. The first enhancement noise reduction circuit 6 may be connected to the input signal end INPUT, the first clock signal input end CLKB and the pull-up node PU, and configured to control the input signal end INPUT to be electrically connected to, or electrically disconnected from, the pull-up node PU under the control of the first clock signal input end CLKB. The second enhancement noise reduction circuit 7 may be connected to the gate driving signal output end OUTPUT, the first level input end VSS and the first clock signal input end CLKB, and configured to control the gate driving signal output end OUTPUT to be electrically connected to, or electrically disconnected from, the first level input end VSS under the control of the first clock signal input end CLKB.

To be specific, at the input phase P1 and the resetting phase P3, the first enhancement noise reduction circuit 6 may control the input signal end INPUT to be electrically connected to the pull-up node PU under the control of the first clock signal input end CLKB, so as to pull up the potential at the pull-up node PU at the input phase P1 in a better manner, and pull down the potential at the pull-up node PU at the resetting phase P3 in a better manner. In this way, it is able to control the potential at the pull-up node PU effectively, improve the noise reduction capability of the shift register unit, and ensure the stability of the shift register unit. In addition, within a part of time period of the maintenance phase P4 (i.e., within a time period where the first clock signal from the first clock signal input end CLKB is at a high level), the first enhancement noise reduction circuit 6 may control the input signal end INPUT to be electrically connected to the pull-up node PU, so as to pull down the potential at the pull-up node PU within this time period, thereby to improve the noise reduction capability of the shift register unit and ensure the stability of the shift register unit.

At the input phase P1 and the resetting phase P3, the second enhancement noise reduction circuit 7 may control the gate driving signal output end OUTPUT to be electrically connected to the first level input end VSS under the control of the first clock signal input end CLKB, so as to pull down a potential at the gate driving signal output end OUTPUT at the input phase P1 and the resetting phase P3 in a better manner, thereby to control the potential at the gate driving signal output end OUTPUT effectively, improve the noise reduction capability of the shift register unit, and ensure the stability of the shift register unit. In addition, within a part of time period of the maintenance phase P4, the second enhancement noise reduction circuit 7 may control the gate driving signal output end OUTPUT to be electrically connected to the first level input end VSS, so as to pull down the potential at the gate driving signal output end OUTPUT within this time period, thereby to improve the noise reduction capability of the shift register unit and ensure the stability of the shift register unit.

Further, the pull-up node control circuit 1 is configured to control the pull-up node PU to be electrically connected to, or electrically disconnected from, the input signal end INPUT under the control of the input signal end INPUT, control the pull-up node PU to be electrically connected to, or electrically disconnected from, the first level input end VSS under the control of the resetting end RESET, and control the pull-up node PU to be electrically connected to, or electrically disconnected from, the first level input end VSS under the control of the pull-down node PD.

To be specific, at the input phase P1, the pull-up node control circuit 1 is configured to control the pull-up node PU to be electrically connected to the input signal end INPUT under the control of the input signal end INPUT. At the other phases other than the input phase P1, the pull-up node control circuit 1 is configured to control the pull-up node PU to be electrically disconnected from the input signal end INPUT under the control of the input signal end INPUT. At the resetting phase P3, the pull-up node control circuit 1 is configured to control the pull-up node PU to be electrically connected to the first level input end VSS under the control of the resetting end RESET, and control the pull-up node PU to be electrically connected to the first level input end VSS under the control of the pull-down node PD. At the input phase P1 and the output phase P2, the pull-up node control circuit 1 is configured to control the pull-up node PU to be electrically disconnected from the first level input end VSS under the control of the resetting end RESET, and control the pull-up node PU to be electrically disconnected from the first level input end VSS under the control of the pull-down node PD. At the maintenance phase P4, the pull-up node control circuit 1 is configured to control the pull-up node PU to be periodically electrically connected to, and electrically disconnected from, the first level input end VSS under the control of the pull-down node PD.

Further, the output circuit 3 is configured to control the second clock signal input end CLK to be electrically connected to, or electrically disconnected from, the gate driving signal output end OUTPUT under the control of the pull-up node PU, control the gate driving signal output end OUTPUT to be electrically connected to, or electrically disconnected from, the first level input end VSS under the control of the pull-down node PD, and control the gate driving signal output end OUTPUT to be electrically connected to, or electrically disconnected from, the first level input end VSS under the control of the resetting end RESET.

To be specific, at the input phase P1 and the output phase P2, the output circuit 3 is configured to control the second clock signal input end CLK to be electrically connected to the gate driving signal output end OUTPUT under the control of the pull-up node PU. At the resetting phase P3 and the maintenance phase P4, the output circuit 3 is configured to control the second clock signal input end CLK to be electrically disconnected from the gate driving signal output end OUTPUT under the control of the pull-up node PU. At the input phase P1 and the output phase P2, the output circuit 3 is further configured to control the gate driving signal output end OUTPUT to be electrically disconnected from the first level input end VSS under the control of the pull-down node PD. At the resetting phase P3, the output circuit 3 is further configured to control the gate driving signal output end OUTPUT to be electrically connected to the first level input end VSS under the control of the pull-down node PD. At the maintenance phase P4, the output circuit 3 is further configured to control the gate driving signal output end OUTPUT to be periodically connected to, and disconnected from, the first level input end VSS under the control of the pull-down node PD.

In addition, at the resetting phase P3, the output circuit 3 is further configured to control the gate driving signal output end OUTPUT to be electrically connected to the first level input end VSS under the control of the resetting end RESET. At the input phase P1 and the output phase P2, the output circuit 3 is further configured to control the gate driving signal output end OUTPUT to be electrically disconnected from the first level input end VSS under the control of the resetting end RESET. In other words, at the resetting phase P3, the output circuit 3 may control the gate driving signal output end OUTPUT to be electrically connected to the first level input end VSS under the control of the pull-down node PD, and control the gate driving signal output end OUTPUT to be electrically connected to the first level input end VSS under the control of the resetting end RESET. In this way, it is able to prevent the gate driving signal output end OUTPUT from outputting the gate driving signal at the resetting phase P3, thereby to ensure the stability of the shift register unit.

Referring to FIG. 3 again, the pull-up node control circuit 1 may include a first switching transistor T1, a second switching transistor T2 and a third switching transistor T3. A gate electrode and a second electrode of the first switching transistor T1 may be connected to the input signal end INPUT, and a first electrode of the first switching transistor T1 may be connected to the pull-up node PU. A gate electrode of the second switching transistor T2 may be connected to the resetting end RESET, a first electrode of the second switching transistor T2 may be connected to the first level input end VSS, and a second electrode of the second switching transistor T2 may be connected to the pull-up node PU. A gate electrode of the third switching transistor T3 may be connected to the pull-down node PD, a first electrode of the third switching transistor T3 may be connected to the first level input end VSS, and a second electrode of the third switching transistor T3 may be connected to the pull-up node PU.

To be specific, the first switching transistor T1 may be turned on or off under the control of the input signal end INPUT, so as to control the input signal end INPUT to be electrically connected to, or electrically disconnected from, the pull-up node PU. The second switching transistor T2 may be turned on or off under the control of the resetting end RESET, so as to control the pull-up node PU to be electrically connected to, or electrically disconnected from, the first level input end VSS. The third switching transistor T3 may be turned on or off under the control of the pull-down node PD, so as to control the pull-up node PU to be electrically connected to, or electrically disconnected from, the first level input end VSS.

The output circuit 3 may include a fourth switching transistor T4, a fifth switching transistor T5 and a sixth switching transistor T6. A gate electrode of the fourth switching transistor T4 may be connected to the pull-up node PU, a first electrode of the fourth switching transistor T4 may be connected to the gate driving signal output end OUTPUT, and a second electrode of the fourth switching transistor T4 may be connected to the second clock signal input end CLK. A gate electrode of the fifth switching transistor T5 may be connected to the pull-down node PD, a first electrode of the fifth switching transistor T5 may be connected to the first level input end VSS, and a second electrode of the fifth switching transistor T5 may be connected to the gate driving signal output end OUTPUT. A gate electrode of the sixth switching transistor T6 may be connected to the resetting end RESET, a first electrode of the sixth switching transistor T6 may be connected to the first level input end VSS, and a second electrode of the sixth switching transistor T6 may be connected to the gate driving signal output end OUTPUT.

More specifically, the fourth switching transistor T4 may be turned on or off under the control of the pull-up node PU, so as to control the second clock signal input end CLK to be electrically connected to, or electrically disconnected from, the gate driving signal output end OUTPUT. The fifth switching transistor T5 may be turned on or off under the control of the pull-down node PD, so as to control the gate driving signal output end OUTPUT to be electrically connected to, or electrically disconnected from, the first level input end VSS. The sixth switching transistor T6 may be turned on or off under the control of the resetting end RESET, so as to control the gate driving signal output end OUTPUT to be electrically connected to, or electrically disconnected from, the first level input end VSS.

The pull-down node control circuit 2 may include a seventh switching transistor T7, an eighth switching transistor T8, a ninth switching transistor T9 and a tenth switching transistor T10. A gate electrode and a second electrode of the seventh switching transistor T7 may be connected to the first clock signal end CLKB, and a first electrode of the seventh switching transistor T7 may be connected to a pull-down control node PD_CN. A gate electrode of the eighth switching transistor T8 may be connected to the pull-up node PU, a first electrode of the eighth switching transistor T8 may be connected to the first level input end VSS, and a second electrode of the eighth switching transistor T8 may be connected to the pull-down control node PD_CN. A gate electrode of the ninth switching transistor T9 may be connected to the pull-down control node PD_CN, a first electrode of the ninth switching transistor T9 may be connected to the pull-down node PD, and a second electrode of the ninth switching transistor T9 may be connected to the first clock signal input end CLKB. A gate electrode of the tenth switching transistor T10 may be connected to the pull-up node PU, a first electrode of the tenth switching transistor T10 may be connected to the first level input end VSS, and a second electrode of the tenth switching transistor T10 may be connected to the pull-down node PD.

To be specific, the seventh switching transistor T7 may be turned on or off under the control of the first clock signal input end CLKB, so as to control the first clock signal input end CLKB to be electrically connected to, or electrically disconnected from, the pull-down control node PD_CN. The eighth switching transistor T8 may be turned on or off under the control of the pull-up node PU, so as to control the pull-down control node PD_CN to be electrically connected to, or electrically disconnected from, the first level input end VSS. The ninth switching transistor T9 may be turned on or off under the control of the pull-down control node PD_CN, so as to control the first clock signal input end CLKB to be electrically connected to, or electrically disconnected from, the pull-down node PD. The tenth switching transistor T10 may be turned on or off under the control of the pull-up node PU, so as to control the first level input end VSS to be electrically connected to, or electrically disconnected from, the pull-down node PD.

More specifically, at the input phase P1 and the output phase P2, the first switching transistor T7 may be turned on under the control of the first clock signal input end CLKB, and the eighth switching transistor T8 may be turned on under the control of the pull-up node PU, so as to control the pull-down control node PD_CN to be electrically connected to the first level input end VSS, thereby to control the pull-down node PD_CN to be at a low potential. At the resetting phase P3, the seventh switching transistor T7 may be turned on under the control of the first clock signal input end CLKB, and the eighth switching transistor T8 may be turned off under the control of the pull-up node PU, so as to control the pull-down control node PD_CN to be at a high potential. The tenth switching transistor T10 may be turned off under the control of the pull-up node PU, and the tenth switching transistor T9 may be turned on under the control of the pull-down control node PD_CN at the high potential, so as to enable the pull-down node PD to be electrically connected to the first clock signal input end CLKB, thereby to pull up the potential at the pull-down node PD to be a high potential. At the maintenance phase P4, the seventh switching transistor T7 and the ninth switching transistor T9 may be periodically turned on and off under the control of the first clock signal input end CLKB, so as to enable the potential at the pull-down control node PD_CN to be to the same as a potential of the first clock signal from the first clock signal input end CLKB, and enable the potential at the pull-down node PD to be to the same as the potential of the first clock signal from the first clock signal input end CLKB.

Further, the first enhancement noise reduction circuit 6 may include an eleventh switching transistor T11, a gate electrode of which is connected to the first clock signal input end CLKB, a first electrode of which is connected to the pull-up node PU, and a second electrode of which is connected to the input signal end INPUT. To be specific, the eleventh switching transistor T11 may be turned on or off under the control of the first clock signal input end CLKB, so as to control the input signal end INPUT to be electrically connected to, or electrically disconnected from, the pull-up node PU.

Further, the second enhancement noise reduction circuit 7 may include a twelfth switching transistor T12, a gate electrode of which is connected to the first clock signal input end CLKB, a first electrode of which is connected to the first level input end VSS, and a second electrode of which is connected to the gate driving signal output end OUTPUT. To be specific, the twelfth switching transistor T12 may be turned on or off under the control of the first clock signal input end CLKB, so as to control the gate driving signal output end OUTPUT to be electrically connected to, or electrically disconnected from, the first level input end VSS.

Further, the capacitor circuit 4 may include a first capacitor C1, a first end of which is connected to the pull-up node, and a second end of which is connected to the gate driving signal output end.

It should be appreciated that, the above switching transistors may be N-type transistors, each first electrode may be a source electrode, and each second electrode may be a drain electrode. However, the switching transistors may also be P-type transistors, which also falls within the scope of the present disclosure. In addition, in a normal case, the first level signal from the first level input end VSS may be a low level signal, i.e., the first level input end VSS may be connected to a power source negative end. However, the present disclosure shall not be limited thereto.

The present disclosure further provides in some embodiments a gate driving circuit including the above-mentioned shift register unit.

To be specific, the gate driving circuit may include a plurality of shift register units. An $(N-1)^{th}$ gate driving signal output end of an $(N-1)^{th}$-level shift register unit may be connected to an $N^{th}$ input signal end of an $N^{th}$-level shift register unit, and an $N^{th}$ resetting end of the $N^{th}$-level shift register unit may be connected to an $(N+1)^{th}$ gate driving signal output end of an $(N+1)^{th}$-level shift register unit, where N is an integer greater than or equal to 2.

The above-mentioned shift register unit may include the noise reduction adjustment circuit 5 configured to slowly pull up the potential at the pull-down node PD from a low potential to a high potential within the noise reduction time period, thereby to increase anti-leakage current capability for the shift register unit while ensuring the noise reduction capability of the shift register unit. In addition, the noise reduction adjustment circuit 5 is further configured to slowly pull down the potential at the pull-down node PD from a high potential to a low potential within the non-noise-reduction time period, thereby to ensure the noise reduction capability to some extent while ensuring the anti-leakage current capability for the shift register unit. Hence, when the gate driving circuit includes the shift register unit, it is also able to prevent the occurrence of the leakage current while ensuring the noise reduction capability at the maintenance phase P4, thereby to ensure the stability of the gate driving circuit.

It should be appreciated that, the gate driving circuit may be manufactured as follows. At first, a GOA model capable of meeting an actual need may be established in accordance with the structure of the above-mentioned shift register unit. Next, the established GOA model may be simulated through simulation software, so as to acquire parameters of the TFTs, the noise reduction capacitors C2 and the noise reduction resistors R in the GOA model. Next, a GOA layout may be drawn in accordance with the parameters, and placed in a panel layout. Finally, a complete panel may be formed through film-forming, exposing and etching in accordance with the panel layout.

The present disclosure further provides in some embodiments a method for driving the above-mentioned shift register unit, including, within the noise reduction time period of the maintenance phase P4, reducing, by the noise reduction adjustment circuit 5, an increasing rate of a potential at the pull-down node PD, and within the non-noise-reduction time period of the maintenance phase P4, reducing, by the noise reduction adjustment circuit 5, a decreasing rate of the potential at the pull-down node PD.

To be specific, each operating period of the shift register unit may include the input phase P1, the output phase P2, the resetting phase P3 and the maintenance phase P4 arranged sequentially. Within each operating period, the method may include the following steps.

At the input phase P1, the pull-up node control circuit 1 may control the input signal end INPUT to be electrically connected to the pull-up node PU under the control of the input signal end INPUT so as to pull up the potential at the pull-up node PU. The pull-down node control circuit 2 may control the pull-down node PD to be electrically connected to the first level input end VSS under the control of the pull-up node PU.

At the output phase P2, the output circuit 3 may control the second clock signal input end CLK to be electrically connected to the gate driving signal output end OUTPUT under the control of the second clock signal input end CLK and the pull-up node PU, so as to enable the gate driving signal output end OUTPUT to output the gate driving signal and further pull up the potential at the pull-up node PU. The pull-down node control circuit 2 may continue to control the pull-down node PD to be electrically connected to the first level input end VSS under the control of the pull-up node PU.

At the resetting phase P3, the pull-up node control circuit 1 may control the pull-up node PU to be electrically connected to the first level input end VSS under the control of the resetting end RESET so as to pull down the potential at the pull-up node PU. The pull-down node control circuit 2 may control the first clock signal input end CLKB to be electrically connected to the pull-down node PD under the control of the first clock signal input end CLKB and the pull-up node PU at a low potential, so as to pull up the potential at the pull-down node PD. The pull-up node control circuit 1 may control the pull-up node PU to be electrically connected to the first level input end VSS under the control of the pull-down node PD at a high potential. The output circuit 3 may control the gate driving signal output end OUTPUT to be electrically connected to the first level input end VSS under the control of the pull-down node PD at a high potential, so as to enable the gate driving signal output end OUTPUT not to output the gate driving signal. The output circuit 3 may control the gate driving signal output end OUTPUT to be electrically connected to the first level input end VSS under the control of the resetting end RESET.

At the maintenance phase P4, the pull-down node control circuit 2 may control the potential at the pull-down node PD to change synchronously with the first clock signal (inputted by the first clock signal input end CLKB) under the control of the first clock signal input end CLKB and the pull-up node PU at a low potential. Further, the maintenance phase P4 may include the noise reduction time period M1 and the non-noise-reduction time period M2. Within the noise reduction time period M1, the potential at the pull-down node PD may be pulled up to a high potential along with the first clock signal. Under the control of the pull-down node PD at a high potential, the output circuit 3 may control the gate driving signal output end OUTPUT to be electrically connected to the first level input end VSS, and the pull-up node control circuit 1 may control the pull-up node PU to be electrically connected to the first level input end VSS, so as to achieve a noise reduction function of the shift register unit. Within the non-noise-reduction time period M2, the potential at the pull-down node PD may be pulled down to a low potential along with the first clock signal, so as to prevent the occurrence of a relatively large leakage current for a TFT in each module connected to the pull-down node PD, thereby to prevent a characteristic of each TFT from being offset forward. In addition, at the maintenance phase P4, the pull-up node PU is at a low potential. Under the control of the pull-up node PU at a low potential, the output circuit 3 may control the gate driving signal output end OUTPUT to be electrically disconnected from the second clock signal input end CLK, so as to further enable the gate driving signal output end OUTPUT not to output the gate driving signal.

In addition, at the maintenance phase P4, the noise reduction adjustment circuit 5 may adjust a change rate of the potential at the pull-down node PD. To be specific, within the noise reduction time period of the maintenance phase P4, the noise reduction adjustment circuit 5 may reduce the increasing rate of the potential at the pull-down node PD, and within the non-noise-reduction time period of the maintenance phase P4, the noise reduction adjustment circuit 5 may reduce the decreasing rate of the potential at the pull-down node PD.

When the method is used to drive the shift register unit, it is able to reduce the increasing rate of the potential at the pull-down node PD within the noise reduction time period of the maintenance phase P4, and reduce the decreasing rate of the potential at the pull-down node PD within the non-noise-reduction time period of the maintenance phase P4. Hence, when driving the shift register unit through the method, it is able to slowly pull up the potential at the pull-down node PD from a low potential to a high potential within the noise reduction time period, thereby to increase anti-leakage current capability for the shift register unit while ensuring the noise reduction capability of the shift register unit. In addition, it is able to slowly pull down the potential at the pull-down node PD from a high potential to a low potential within the non-noise-reduction time period, thereby to ensure the noise reduction capability to some extent while ensuring the anti-leakage current capability for the shift register unit.

In other words, when driving the shift register unit through the above-mentioned method, it is able to ensure the noise reduction capability of the shift register unit and prevent the occurrence of the leakage current at the maintenance phase P4. As a result, after a long-term use, it is able to ensure the stable characteristic of each TFT in the shift register unit (i.e., prevent a threshold voltage of the TFT from being offset), and ensure the excellent noise reduction performance of the shift register unit at the entire maintenance stage P4, thereby to ensure the stability of the shift register unit in a better manner.

It should be appreciated that, the features, structures or materials may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising:
   a pull-up node control circuit connected to an input signal end, a pull-up node, a resetting end, a first level input end and a pull-down node;
   a pull-down node control circuit connected to a first clock signal input end, the pull-up node, the first level input end and the pull-down node;
   a capacitor circuit connected to the pull-up node and a gate driving signal output end;
   an output circuit connected to a second clock signal input end, the pull-up node, the pull-down node, the gate driving signal output end, the first level input end and the resetting end; and
   a noise reduction adjustment circuit connected to the pull-down node and the first level input end, and configured to reduce an increasing rate of a potential at the pull-down node within a noise reduction time period of a maintenance phase for the shift register unit, and reduce a decreasing rate of the potential at the pull-down node within a non-noise-reduction time period of the maintenance phase.

2. The shift register unit according to claim 1, wherein the noise reduction adjustment circuit comprises a second capacitor, a first end of which is connected to the pull-down node, and a second end of which is connected to the first level input end.

3. The shift register unit according to claim 2, wherein the noise reduction adjustment circuit further comprises a first resistor via which the second end of the second capacitor is connected to the first level input end.

4. The shift register unit according to claim 1, further comprising:
   a first enhancement noise reduction circuit connected to the input signal end, the first clock signal input end and the pull-up node, and configured to control the input signal end to be electrically connected to, or electrically disconnected from, the pull-up node under the control of the first clock signal input end; and/or a second enhancement noise reduction circuit connected to the gate driving signal output end, the first level input end and the first clock signal input end, and configured to control the gate driving signal output end to be electrically connected to, or electrically disconnected from, the first level input end under the control of the first clock signal input end.

5. The shift register unit according to claim 1, wherein the pull-up node control circuit is configured to control the pull-up node to be electrically connected to, or electrically disconnected from, the input signal end under the control of the input signal end, control the pull-up node to be electrically connected to, or electrically disconnected from, the first level input end under the control of the resetting end, and control the pull-up node to be electrically connected to, or electrically disconnected from, the first level input end under the control of the pull-down node; and the output circuit is configured to control the second clock signal input end to be electrically connected to, or electrically disconnected from, the gate driving signal output end under the control of the pull-up node, control the gate driving signal output end to be electrically connected to, or electrically disconnected from, the first level input end under the control of the pull-down node, and control the gate driving signal output end to be electrically connected to, or electrically disconnected from, the first level input end under the control of the resetting end.

6. The shift register unit according to claim 1, wherein the pull-up node control circuit comprises a first switching transistor, a second switching transistor and a third switching transistor;

a gate electrode and a second electrode of the first switching transistor are connected to the input signal end, and a first electrode of the first switching transistor is connected to the pull-up node;

a gate electrode of the second switching transistor is connected to the resetting end, a first electrode of the second switching transistor is connected to the first level input end, and a second electrode of the second switching transistor is connected to the pull-up node; and a gate electrode of the third switching transistor is connected to the pull-down node, a first electrode of the third switching transistor is connected to the first level input end, and a second electrode of the third switching transistor is connected to the pull-up node.

7. The shift register unit according to claim 1, wherein the output circuit comprises a fourth switching transistor, a fifth switching transistor and a sixth switching transistor;

a gate electrode of the fourth switching transistor is connected to the pull-up node, a first electrode of the fourth switching transistor is connected to the gate driving signal output end, and a second electrode of the fourth switching transistor is connected to the second clock signal input end;

a gate electrode of the fifth switching transistor is connected to the pull-down node, a first electrode of the fifth switching transistor is connected to the first level input end, and a second electrode of the fifth switching transistor is connected to the gate driving signal output end; and a gate electrode of the sixth switching transistor is connected to the resetting end, a first electrode of the sixth switching transistor is connected to the first level input end, and a second electrode of the sixth switching transistor is connected to the gate driving signal output end.

8. The shift register unit according to claim 1, wherein the pull-down node control circuit comprises a seventh switching transistor, an eighth switching transistor, a ninth switching transistor and a tenth switching transistor;

a gate electrode and a second electrode of the seventh switching transistor are connected to the first clock signal end, and a first electrode of the seventh switching transistor is connected to a pull-down control node;

a gate electrode of the eighth switching transistor is connected to the pull-up node, a first electrode of the eighth switching transistor is connected to the first level input end, and a second electrode of the eighth switching transistor is connected to the pull-down control node;

a gate electrode of the ninth switching transistor is connected to the pull-down control node, a first electrode of the ninth switching transistor is connected to the pull-down node, and a second electrode of the ninth switching transistor is connected to the first clock signal input end; and a gate electrode of the tenth switching transistor is connected to the pull-up node, a first electrode of the tenth switching transistor is connected to the first level input end, and a second electrode of the tenth switching transistor is connected to the pull-down node.

9. The shift register unit according to claim 4, wherein the first enhancement noise reduction circuit comprises an eleventh switching transistor, a gate electrode of which is connected to the first clock signal input end, a first electrode of which is connected to the pull-up node, and a second electrode of which is connected to the input signal end; and the second enhancement noise reduction circuit comprises a twelfth switching transistor, a gate electrode of which is connected to the first clock signal input end, a first electrode of which is connected to the first level input end, and a second electrode of which is connected to the gate driving signal output end.

10. The shift register unit according to claim 1, wherein the capacitor circuit comprises a first capacitor, a first end of which is connected to the pull-up node, and a second end of which is connected to the gate driving signal output end.

11. The shift register unit according to claim 1, wherein within the noise reduction time period, a first clock signal from the first clock signal input end is a low level, a second clock signal from the second clock signal input end is a high level, and a resetting signal from the resetting end is a low level; and within the non-noise-reduction time period, the first clock signal from the first clock signal input end is a high level, the second clock signal from the second clock signal input end is a low level, and the resetting signal from the resetting end is a low level.

12. A gate driving circuit, comprising a plurality of shift register units according to claim 1.

13. A method for driving the shift register unit according to claim 1, comprising, within a noise reduction time period of a maintenance phase, reducing, by a noise reduction adjustment circuit, an increasing rate of a potential at a pull-down node, and within a non-noise-reduction time period of the maintenance phase, reducing, by the noise reduction adjustment circuit, a decreasing rate of the potential at the pull-down node.

14. The method according to claim 13, wherein
within the noise reduction time period, a first clock signal at a low level is applied to a first clock signal input end, a second clock signal at a high level is applied to a second clock signal input end, and a resetting signal at a low level is applied to a resetting end; and
within the non-noise-reduction time period, the first clock signal at a high level is applied to the first clock signal input end, the second clock signal at a low level is applied to the second clock signal input end, and the resetting signal at a low level is applied to the resetting end.

* * * * *